United States Patent [19]

Beelitz et al.

[11] 4,127,860
[45] Nov. 28, 1978

[54] INTEGRATED CIRCUIT MESA BIPOLAR DEVICE ON INSULATING SUBSTRATE INCORPORATING SCHOTTKY BARRIER CONTACT

[75] Inventors: Howard R. Beelitz, Princeton; Donald R. Preslar, Somerville, both of N.J.

[73] Assignee: RCA Corporation, New York, N.Y.

[21] Appl. No.: 788,329

[22] Filed: Apr. 18, 1977

[51] Int. Cl.$^2$ ............................................. H01L 29/48
[52] U.S. Cl. ........................................ 357/15; 357/4; 357/20; 357/34; 357/56; 357/44
[58] Field of Search .................... 357/15, 4, 34, 44, 20, 357/56

[56] References Cited

U.S. PATENT DOCUMENTS

| | | | |
|---|---|---|---|
| 3,304,469 | 2/1967 | Weimer | 357/4 |
| 3,602,781 | 8/1971 | Hart | 357/15 |
| 3,742,368 | 6/1973 | Gelabert | 357/15 |

OTHER PUBLICATIONS

R. Broom, "Lateral Bipolar Transistor Having a Negative Resistance Characteristic," IBM Tech. Discl. Bull., vol. 14 #4, Sep. 1971, pp. 1343-1344.
G. Zeidenbergs, "Lateral PNP Transistor with Schottky Barrier Collector," IBM Tech. Discl. Bull., vol. 14 #11, Apr. 1972, p. 3248.

*Primary Examiner*—Joseph E. Clawson, Jr.
*Attorney, Agent, or Firm*—Edward J. Norton

[57] ABSTRACT

A PNP bipolar transistor is protected by a Schottky barrier, in which an N- base of the device forms a Schottky diode with a metallizing which is used as the collector. No separate P- semiconductor region is provided as the collector. Such transistors may be combined with NPN transistors having integrated but distinct Schottky and collector electrodes.

9 Claims, 7 Drawing Figures

INTEGRATED CIRCUIT MESA BIPOLAR DEVICE ON INSULATING SUBSTRATE INCORPORATING SCHOTTKY BARRIER CONTACT

This invention relates to a semiconductor device including a bipolar transistor in which an operating voltage is clamped by the action of a Schottky diode. Usually the diode will be integral with the device, and primarily the invention is particularly useful where the device and the diode are located together within a dielectrically isolated pocket in an integrated circuit environment.

A Schottky-barrier diode has a layer of a suitable metal in contact with a surface of a moderately or lightly doped semiconductor body. Typically, for a bipolar transistor device, the metal contact will bridge a highly doped area contacting a base region of the device and a lightly doped area contacting a collector region. These collector and base regions of the device are thus shunted by the Schottky barrier, such that the collector/base forward bias is limited and the effects of minority carrier generation and storage in the two electrode regions are largely cancelled. Such an arrangement and its advantages are described in U.S. Pat. No. 3,623,925 to R. T. Jenkins et al.

Economies of processing steps and of space occupied per device are always important, particularly in integrated circuits, and the invention aims at enabling economy, reliability, versatility, high performance and provision of protected integrated complementary transistors in Schottky-protected bipolar integrated circuit devices.

In the present device, a bipolar transistor has a collector region formed by a Schottky barrier with the base being the semiconductor side of the Schottky junction. The Schottky barrier is the base collector junction. Thus, the Schottky barrier is in direct series with the emitter/base path in the transistor, and not in a shunt path as in previously proposed Schottky protected devices. Preferred embodiments are PNS (P-N-Schottky) transistors, because higher performances are customarily obtainable already from NPN transistors, and so the PNP type is more desirably improved.

Figure 1:
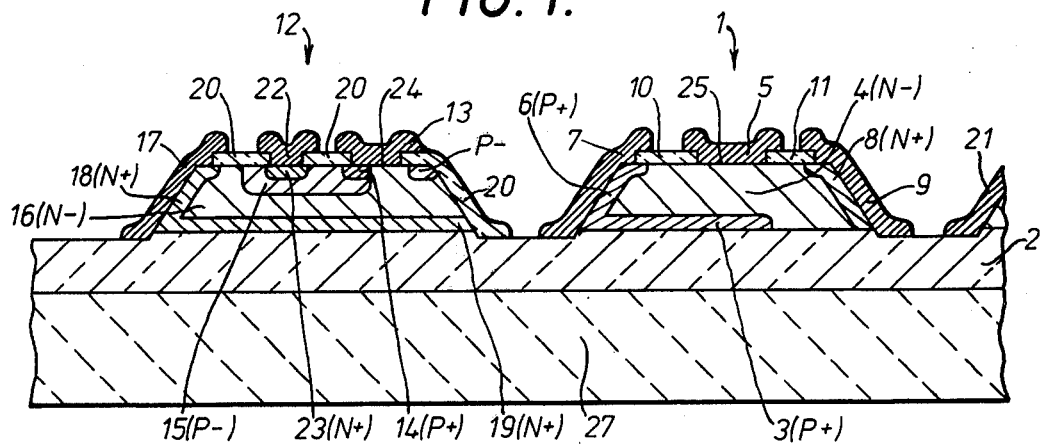
FIG. 1 is a partial cross section of an integrated circuit device showing separately dielectrically isolated, a PNS transistor, and a complementary, Schottky clamped NPN transistor.

FIG. 1 shows a portion of an integrated circuit structure which embodies the present invention. A PNS transistor 1 is shown in combination with a Schottky-clamped NPN transistor 12. In the PNS transistor 1, there is no P collector region. In conventional PNP transistors, the device tends, undesirably, to store minority carriers when the base/collector junction is forward biased. Such stored carriers can slow the transistor response to rapidly alternating or fluctuating voltage conditions.

The PNS transistor 1 is of silicon and is arranged on an insulating layer 2, which may be of silicon dioxide. It has a P+ buried emitter region 3 of relatively high conductivity, an N− base region 4 of relatively low doping (from about 0.2 to about 2 ohm/cm resistivity, or somewhat less than $10^{17}/cm^3$ doping to make a satisfactory Schottky junction) and a Schottky metal terminal 5, of aluminum, for example, which forms a Schottky barrier 25 with the N− base region 4 and acts as the collector terminal of the device. The transistor 1 forms a raised mesa-like structure on the oxide layer 2 and at one side of the mesa is a P+ extension 6 of the buried emitter 3 and a metallized emitter terminal 7. On the other side of the mesa is a highly doped N+ contact region 8 for the base region 4 and a base terminal 9. Portions 10 and 11 of an insulating layer isolate the Schottky terminal 5 and the base region 4 from the terminals 7 and 9.

Forming a complementary bipolar pair with the PNS transistor 1 is an NPN transistor 12 having a mesa structure and integral with a protecting Schottky diode by means of a Schottky metallization 13 which bridges a P+ base contact 14 to a P− base region 15 (resistivity 200 ohm/sq or so) and an N− collector region 16, like the N− region 4 of the PNS transistor 1, to form a Schottky barrier 24. This bridging disposition means that the base collector PN junction of the transistor 12 is shunted by a Schottky diode which is reverse biased when the base/collector junction is reverse biased. On one side of the mesa of the transistor 12 is a collector terminal 17 on an N+ extension 18 of an N+ buried pocket collector contact region 19 which ensures extensive contact with the N− collector region 16 to give low saturating resistance to the latter. A metal terminal 22 ohmically contacts an N+ emitter region 23. Like the PNS transistor 1 (and its Schottky component), the transistor 12 has oxide surface coating portions 20.

The mesa structures of these transistors and the oxide layer 2 provide full dielectric and air isolation for the transistors 1 and 12 and for other devices such as that shown fragmentarily at 21. The Schottky barriers 24 and 25 of the two devices are both formed with N material which has advantages but that is not essential to the invention; the semiconductor may be other low or medium doped materials and conductivity types.

The mesa construction also permits contacting via the sloping sides as well as the top side. The bottom sides of the devices all interface with the common oxide layer 2 extending over the whole chip area, and a handle 27 may be provided in well-known manner by a polycrystalline support typically made of the same material as, in single crystal form, the devices are made of, and adhered to the oxide layer 2. The invention is not limited to a PNS device in combination with any other devices, since the novel transistor is itself useful. An economical construction method for the pair of devices of FIG. 1 will now be outlined, by way of example.

Figure 2:
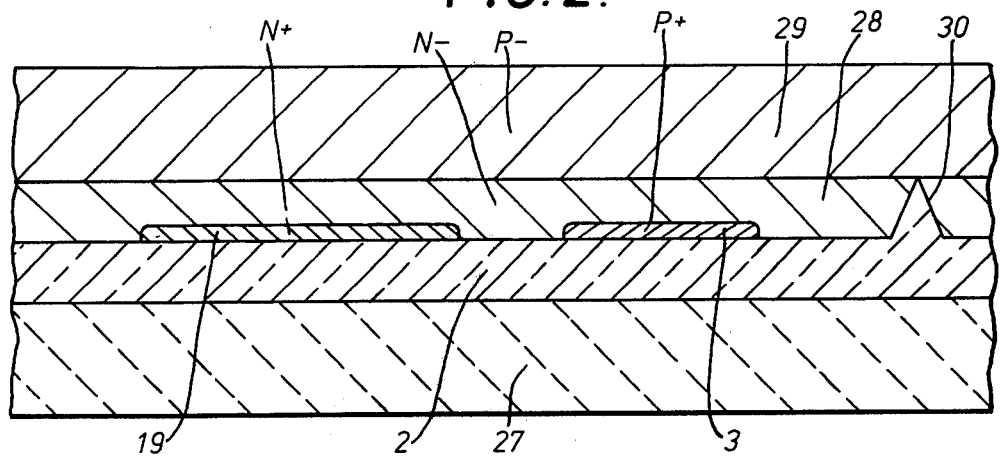
FIG. 2 is a partial cross section of a wafer at an early stage in a method of making the FIG. 1 transistor pair.

Referring to FIG. 2, the starting material for the above pair of devices 1 and 12 can be either an N-bulk wafer or, as shown, an N− epitaxial surface layer 28 grown on a P− bulk wafer or substrate 29. The N− layer 28 is about 2-5 micrometers (μm) thick and will eventually serve both as the N− collector for the NPN transistor 12 and as the N− base for the PNS transistor 1 (and similarly for a presumably large number of other such devices integrated on the chip shown in part in FIG. 1). The layer 28 must be accurately predetermined as regards thickness, since the initial thickness is substantially determinative of the final base width in the PNS transistor, and hence of the latter's performance. It is not critical as regards the base width of the NPN device because the base 15 (see FIG. 1) of that device is implanted or diffused within the layer 28.

Whether the layer 28 should be an epitaxial layer or part of an N− bulk wafer depends on whether one has the facility, by lapping and polishing alone, of being able to control the final N− thickness to a tolerance of several tenths of a micrometer. The use of a bulk starting wafer is simpler, compared with epitaxially producing the layer 28, and potentially able to present a higher degree of crystalline perfection and thus better and more predictable devices.

If lapping and polishing is considered to be inadequate as a control on thickness, the N− epitaxial deposition on a P− substrate 29, actually illustrated, may be used. The wafer may be subjected to relatively coarse lapping and polishing followed by electrochemical etching to remove the initial P− substrate. Accurate control of the thickness of the N− epitaxial layer is readily done and electrochemical removal of the adjacent portions of the P− substrate is self-limiting when the surface of the N− epitaxial layer is reached. The actual step of removing the P− substrate occurs later in the process as described below.

The exposed lower face, as illustrated, of the N− layer 28 next receives diffused N+ regions such as 19 which are to become the N+ buried pockets of NPN transistors such as the transistor 12 of FIG. 1. Definition and alignment of the regions 19 are not critical since their boundaries and the subsequent N− collector region boundaries are later precisely defined by the known V-shaped groove anisotropic etches, which also provide side-wall dielectric/air isolations for the devices.

P+ buried emitter regions 3 are next defined and diffused, for the PNS transistor, such as the transistor 1 of FIG. 1. In this procedure, definition and alignment may or may not be critical, depending on how precisely the base/Schottky contact 25 (FIG. 1) is to be made and defined. For this reason, it may be very important to control, or allow for, any out-diffusion from the P+ regions 3, during any subsequent high-temperature process steps, for instance insulating silicon dioxide formation or wafer handle laminating. For adequate control, a P dopant with a lower diffusion coefficient than boron, such as gallium, may be used. Alternatively, it may be preferred to ion-implant region 3 rather than to diffuse it, since the initial distribution of modifiers may thus be more accurately established.

Alignment holes 30 are now defined, and anisotropically etched to the required depth. The sides of the holes are oblique as shown, due to the etch following the crystal structure, and the angle of inclination to the surface is thus so accurate that the apertures of the mask by which the surface cross sections of holes 30 are defined, correspondingly precisely defines the depths of the apices of the holes. For instance, a sodium hydroxide solution etches silicon preferentially in the <100> direction. Further details of anisotropic etching can be obtained from the literature, e.g. U.S. Pat. Nos. 3,423,651 (Legat et al.), 3,623,218 (mitarai et al.) or 3,818,583 (Polata) and others. The latter also contains a dissertation on dielectric-isolated mesas, and on separate processing of the upper and lower surfaces of a single crystal thickness in turn, using a polycrystalline wafer handle.

If buried pockets 19 or 3 are required to be accurately aligned, they should be produced after the etching of the alignment holes or keys 30. The same considerations apply for any other accurate masking procedure.

The oxide layer 2 is next produced over the entire lower surface of the wafer, covering all the preformed pockets such as 3 and 19 shown. The thickness of the oxide is not electrically critical, and is chosen primarily to give favorable wafer handle attachment. For attachment, the passive "handle" polycrystalline wafer 27, also suitably coated with oxide (not specifically shown), is next laminated to the first "active" wafer consisting of the N layer 28 and the P substrate 29 by means of heat and pressure techniques known in the art, particularly by power device technologists.

The composite wafer structure of FIG. 2 is now ready for thinning, as aforesaid either by lapping and polishing alone, or with gross lapping and polishing followed by electro-mechanical thinning of the substrate 29, and the selected process is then carried out. The extent to which the thinning is carried out may be monitored by observing the appearance of the alignment keys 30.

The transistors 1 and 12 are next separated from each other and provided with full air/dielectric isolation (instead of the more usual but higher capacitance diffused PN junction isolation), by means of further anisotropic etching. This has the additional advantages (for our purposes) of providing mesa structures and lateral contacting facilities. The etching provides the regularly inclined mesa sides shown, and terminates at the oxide layer.

The remaining structure, i.e., the portions of the N− layer 28, the oxide 2 and the handle 27 are next processed so that the now exposed top side of the N− layer 28 and the mesa sides receive, in conventional manner, the various N+, P− and P+ regions of FIG. 1. At the same time as the emitter N+ region 23 is produced, the collector termination from the buried layer 19 is completed by diffusing the N+ region 18 through the wall of the V-groove formed by the etch, thus eliminating need for a deep collector contact diffusion.

The PNS transistor 1 has its P+ emitter contact 6 formed on the inclined lateral wall produced by the etching at the same time as the P+ base contact 14 of the NPN device 12, and the PNS base contact 8 is produced on the opposite lateral wall at the same time as the N+ collector contact 18 and the N+ emitter 23 of the device 12. Thus, to produce the two devices, great economy in processing steps is secured by such use of simultaneous diffusions. The two devices are completed by conventional metallizing steps. Metallized collector/Schottky barrier 25 of the PNS transistor is made simultaneously with the formation of the base/collector clamping barrier 24.

Thus, when a PNS transistor 1 is to be integrated along with a compatible and fully dielectrically isolated (by V-grooves) NPN transistor such as 12, only one extra step, diffusion of the buried P+ emitter, is involved. The resulting complementary bipolar pair can be used in many circuit applications and both devices are Schottky-protected.

The PNS transistor itself has several advantages, namely no deep diffusions, minimal effective collector/base capacitance and storage delay, a high beta, very low saturation resistance (no low conductivity collector bulk), and there is a choice of suitable metals for the Schottky contacts (an ohmic contact not being in question). These advantages make the PNS device especially useful for active load devices, which are favored by minimum capacitance and high beta, and for moderate speed switching applications.

Certain disadvantages may arise in the use of the present PNS transistor 1, rendering it sometimes unattractive for specific requirements. The base width of this device, for instance, is a function of the original N− layer thickness as aforesaid, requiring careful preparation, and the effective width can change with the bias conditions on the device. The base transit time for a given width is found to be only moderate, which may mitigate against high frequency or high frequency bandwidth uses. Attempts to obtain higher operational frequencies by drastic reductions of the base width may bring about breakdowns across the base. Base breakdowns can be countered to some extent by "grading", i.e., making bases non-uniform in doping. The likely frequency performance can be assessed from the following approximate comparison of $f_T$ in various devices. The frequency $f_T$ is that at which $\beta$, the current "amplification", falls to unity. The NPN transistor 12 may have an $f_T$ of 500-1200 MHz. In a PNS transistor, $f_T$ would be about 10 MHz for a diffused emitter as described (or 1 GHz with an ion-implanted emitter). The base/emitter area is relatively large; and there is the aforementioned requirement for the initial emitter P+ diffusion. It should be borne in mind that a high performance PNP transistor is being considered for comparison purposes; high performances are practically not available with PNP transistors. It is reiterated that submicron base width tolerances must be kept in PNS devices to achieve consistent performance levels.

Figure 3:
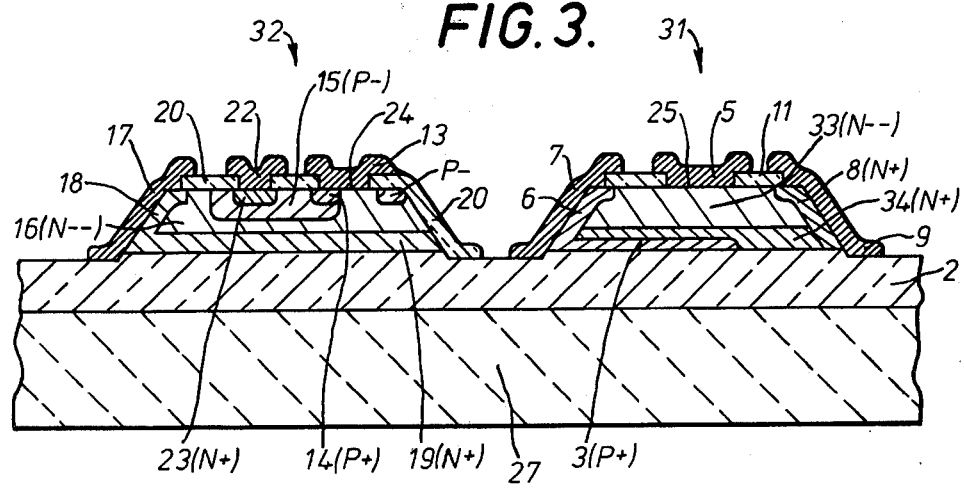
FIG. 3 is a partial cross section of another embodiment of the present device showing a PNS device with a "graded-base", along side a compatible NPN transistor clamped with a shunt Schottky diode.

If base width control and/or breakdown voltage tend to prove seriously disadvantageous in applications of the FIG. 1 embodiment, a "graded base" may be incorporated in the structure to reduce the problem. Referring to FIG. 3, a graded-base PNS transistor 31 is shown alongside a compatible Schottky-clamped NPN transistor 32, which differs only in small ways from the transistor 12 of FIG. 1 and hence uses the same reference numbers thereas for analogous items. The transistor 32 differs from the transistor 12 in having an N− collector region 16 and a rather wider buried N+ collector contact region 19, compared with device 12. The reason is ease of construction rather than electrical significance, as regards device 32. With respect to the PNS transistor 31, however, the base now is graded and comprises an N− region 33 and an N+ buried region 34. One or more intermediately graded base regions may be provided between the regions 33 and 34 if desired.

The advantages of thus grading the base of the PNS transistor 31 into two or more regions of different conductivities and dopings include the following (in comparison with the PNS transistor 1 of FIG. 1): higher breakdown voltages, higher $f_T$ (frequency of unity current gain), simpler processing since masking is not required for the N+ "pocket" diffusion, and a lower $R_{bb'}$, since an extended N+ interface with the N− bulk provides good contact termination.

The disadvantages of the PNS transistor 31 are that the formation of the N+ layer 34 may be more critical, and from an electrical performance point of view, that the PNS beta tends to be lower. Since the N+ layer 34 tends to be thicker than for the PNS transistor 1 of FIG. 1, the layer 19 also is correspondingly thicker in the NPN clamped transistor 32, so that they can be produced at the same time.

Production of the two devices 31, 32 differs from that for the FIG. 1 devices in that when processing the lower surface, an N+ layer is first diffused or implanted over the entire surface to the considerable depth likely to be beneficial for the graded base of the PNS transistor 31. Also, the grading enables the rest of the base, or part of the rest, to be N− material, so that such low doped silicon is used as the starting layer 28 (cf FIG. 2). The P+ buried emitters 3 are next mask-defined, and either diffused or ion-implanted in the N+ material. Boron has a higher diffusion coefficient than gallium, among acceptor dopants, and the latter may be preferred, in that it will not "outdiffuse" during subsequent high temperature processing as readily as boron, thus permitting higher, stable surface concentrations, and so more precisely defined junction locations. Since N− collector bulk is used in the NPN transistor 32, the saturation resistance may be raised somewhat.

Figure 4:
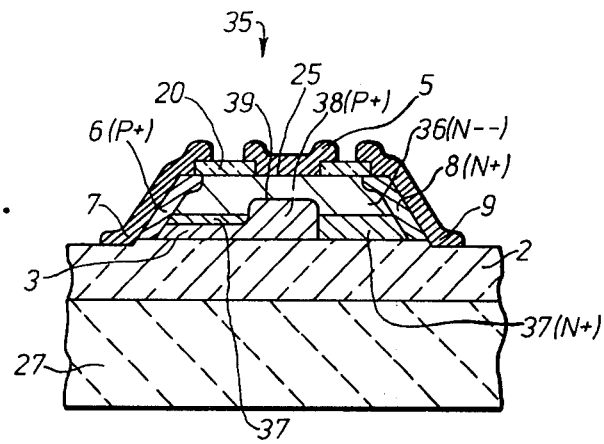
FIG. 4 is a partial cross section of still another embodiment of the present device showing a dielectric isolated PNS transistor with an ion-implanted buried emitter.

A further development of the novel PNS transistor is illustrated generally at 35 in FIG. 4. The transistor 35 preferably has its base graded into an N− bulk portion 36 and an N+ contact portion 37 is series with the base contact region 8. Only the portion 36 lies between the actual emitter, which in this embodiment is a relatively deeply implanted region 38, and the Schottky barrier collector 25. The emitter region 38 projects inward into the N− bulk from the buried P+ region 3 common to previous embodiments, where it served alone as the PNS transistor emitter. The emitter 38 is now terminated via 3, 6 and 7, and its top surface 39 is separated by only ½ μm or even less beneath the Schottky barrier 25, which, being a micro-alloy and not a diffusion is typically less than 0.1 μm from the original surface of the N− silicon bulk 36.

Since, therefore, very narrow base widths are thus obtained by this emitter variation, especially high $f_T$ transistors are obtained (at the expense of the extra step of ion implanting the emitter region 38). Since the ion-implantation governs the base width, (the implant is made, after handle attachment and lapping or etching, into the surface 25), the initial lapping and etching accuracy is less critical. There may be some difficulty in obtaining adequate doping concentration at the ion-implanted surface 39, particularly in view of the like use of N− bases. Therefore, the emitter efficiency and beta tend to be a problem to maximize.

As the FIG. 4 PNS transistor 35 obtains very high $f_T$ at the expense of relatively low base breakdown voltage, it should not be considered a general purpose device. It could advantageously be used as the first stage in a cascode configuration with either the FIG. 1 or FIG. 3 PNS transistor, the base/collector voltages being held low and constant.

The specific configuration of FIG. 4 lends itself well to integrated structures where the implanted emitter PNS transistor 35 is to be produced at the same time and on the same chip as the graded base PNS transistor of FIG. 3.

Figure 5:
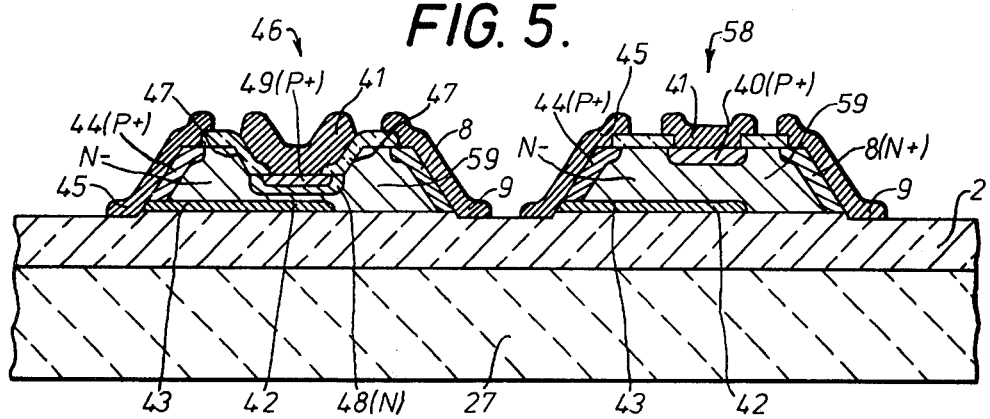
FIG. 5 is a partial cross section of a wafer having two different PNS devices, with buried collectors.

Two other PNS transistor embodiments are shown in FIG. 5. These devices have buried Schotty-collectors and surface P+ emitters. Referring to FIG. 5, the right hand transistor 58 has an N− base 59 from single crystal bulk epitaxial or substrate N− material, a P+ emitter 40 diffused therein and a metal emitter terminal 41. This transistor 58 also has a metal silicide collector region 42. Metal silicide is used rather than metal alone, in not only providing the Schottky barrier, at 43, but also forming a refractory metal system. In the absence of refractory characteristics, an initially formed Schottky barrier might not be able to withstand the high temperatures associated with the wafer handle 27 attachment and subsequent diffusions. The metal silicide "collector" 42 is terminated via a P+ lateral diffusion 44 and a metal contact 45. Base contact is made as in the transistor 1 through an N+ diffusion 8 and a contact 9. The PNS transistor 58, in having a surface diffused emitter, tends to have a higher emitter efficiency than the buried emitters give to previous embodiments, which leads to improved values of beta.

FIG. 5 also shows a neighboring transistor 46 which is similar to the transistor 55 but has a local central anisotropic etched recess 47 in the top surface, adjacent to which is an N or N+ base region 48 to provide a graded-base of the type previously discussed. This structure enables narrower bases and an emitter P+ region 49 of high emitter efficiency (as in the transistor 58), and gives a further reduced base width in the graded base and thus a further enhanced $f_T$. Yet higher $f_T$ is possible by using a drift field base (well known from alloy transistors) to improved high frequency performance and to reduce $R_{bb'}$.

Although shown side by side for convenience in discussing their similarities, the PNS transistors 58 and 46 are quite separate and self-standing component designs. Useful silicides for the collector 42 of each device may be of aluminum, palladium, nickel, platinum, or other suitable metal.

Figure 6:
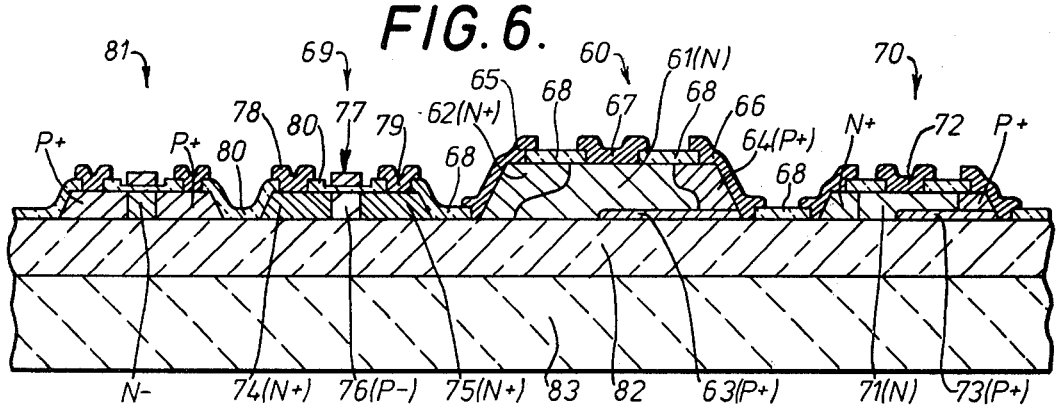
FIG. 6 is a partial cross section showing PNS devices in integrated circuit combination with complementary-symmetry FET (COS/MOS) devices.

It is attractive to consider the PNS structures basic to the instant invention in integrated circuit combination wthh MOS technology, in particular complementary symmetry MOS devices (COS/MOS). At first, the known silicon-on-sapphire COS/MOS techniques would seem appropriate to extend to combination with the present PNS transistors, but the lifetime of a minority carrier on sapphire will frequently be inadequate for satisfactory bipolar action. We find more satisfactory the use of an epitaxial layer on P− substrate, which is suitably lapped and etched away after a wafer handle is formed, as already discussed herein. FIG. 6 shows such a structure and FIG. 7 a stage in its production.

Referring to FIG. 6, a PNS high voltage breakdown transistor 60 has a graded conductivity N base 61, a base terminal N+ region 62, a P+ emitter 63, a P+ terminal region 64 for the emitter, and base and emitter metal contacts 65 and 66 on the sides of the transistor 60. At the upper surface of the mesa is a Schottky metallization 67 contacting the graded base 61 at a surface portion where the concentration is less than the $10^{17}$ or so (dependent on the materials), whereat contact becomes ohmic. The transistor 60 may have applied oxide insulation 68 where appropriate between electrode contacts and between it and neighboring devices, i.e., an N-MOS transistor 69 and an input-output interfacing PNS transistor 70. The transistor 60 adapts the input of the transistor 70 to the input of N-MOS transistor 69, and the transistor 60 therefore has a $BV_{CEO}$ (breakdown voltage with collector/emitter open-circuited) of 15 volts, and an $f_T$ of about 100 MHz. Thus, it obtains this high voltage breakdown (compatible with the C-MOS output) at the expense of $f_T$ (defined above).

In contrast, the output PNS transistor 70 has a low impedance, and is physically much smaller and lower level operative, but has a higher $f_T$ (1GHz) if this is required. It also has a graded N base 71, generally having similar but reduced size geometry relative to the base 61 of the transistor 60.

The graded bases 61 and 71 have lower concentration near the Schottky collector metals 67 and 72, in known manner for bipolars generally giving higher frequency operability. The buried emitters 63 and 73 are similar to the corresponding elements in the FIG. 3 transistor 31. $BV_{CEO}$ may be about 5volts for this transistor 70.

The N-channel MOS transistor 69 has the usual N+ source 74 and drain 75 and a P-channel region 76 controlled by a gate 77 to give an enhancement device. Metallizations 78 and 79 ohmically contact the source and drain 74 and 75, respectively, and oxide layers 80 isolate and protect the device surface, in particular from direct contact with the gate 77 and from a neighboring P-MOS enhancement FET transistor 81. The transistor 81 is symmetrical and complementary with device 69 in known manner, and will not be further described. The sources and drains of the COS/MOS pair may be diffused or ion-implanted. The four devices lie on an insulating oxide layer 82 produced as described for the layer 29, FIGS. 1 and 2, and the chip has a wafer handle 83 attached, also as before. The drift field bases are diffused prior to attachment of the wafer handle.

The $f_T$ and $BV_{CEO}$ compromise or trade-off is inherent in any low resistivity bipolar collecting geometry. The physical geometry differences (mainly depth of diffusion) in the bases determines the compromise values. The intermediate device 60 thus provides on-chip voltage level shifting from the high voltage COS/MOS pair to the high-speed output device 70. The success of the circuit depends on careful preparation of an initial N− epitaxial film, see FIG. 7, e.g. by lapping and etching. At several micrometers only, integrated high-voltage sub-nanosecond MOS logic is obtainable with very acceptable parameters as regards the on-chip high gain, low voltage and noise level bipolar interfacing.

Figure 7:
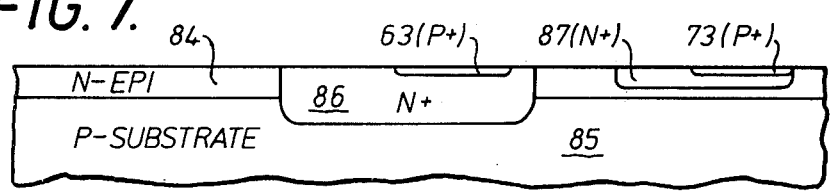
FIG. 7 is a partial cross section of a wafer at an early stage in a method for the production of the FIG. 6 combination.

Referring to FIG. 7, as well as FIG. 6, the four devices of the latter are prepared as follows. An N-epitaxial layer 84 is deposited on a suitably prepared P-substrate 85. Although desirable, it is not essential that layer 84 be epitaxial. Then, a deep N+ drift field base layer 86 is diffused, destined for the high voltage PNS 60 and a shallower N+ layer 87 is diffused for the base 71 of the high $f_T$ device 70. The layer 85 extends right through the layer 84 into the substrate, the layer 87 only part way into the epitaxial layer.

Next, the P+ emitters 63 and 73 of the PNS devices are produced, as by diffusion, and then the polycrystalline handle 83 (FIG. 6) is attached on the top side of layer 84 as viewed in FIG. 7. The P− substrate 85 is next lapped and/or etched away upwards to the surface level 87 of the N+ layer 86, viewed in FIG. 7. The next step is the separation of the epitaxial layer 86 into the mesas of the four devices. This separation is achieved by means of anisotropic etching described previously herein. The four mesas are held together by the wafer handle 83. After this, an N+ diffusion produces at once the source 74 and drain 75 of the MOS transistor 69 and the N+ base contacts of the two PNS transistors. Then, a P+ diffusion produces the source and drain of the MOS transistor 81 and the emitter contacts of the devices 60 and 70. The diffusion of the MOS electrodes may be preceded by formation of their insulated gates, and these could serve as masks for the diffusions. Alternatively, ion-implantations can be used for the MOS electrodes. All the thin oxide coatings such as 68, 80 are then produced in the next step, metal ohmic contacts are next applied, and then the metallizations 67, 72 of the Schottky diodes. Finally an overall protective oxide (not shown) may complete the processing. The oxide layer 82 is produced before the handle 83 is laminated on, as described above with respect to FIG. 2.

We have dwelt on the compatibility, with other components, of PNS devices, but they should equally be considered singly or plurally as stand-alone devices due to their many merits.

Outstanding features may be, depending on what use is contemplated, low collector-base "Miller Capacitance", because the Schottky collector area is not determined by the emitter and base contact geometry as in ordinary bipolars. Also given are complete dielectric isolation of devices, simplicity of structure, very low storage delay and $R_{sat}$ (because no collector bulk is in series). Moreover, high component densities are possible. In either the ion-implanted emitter configuration or its drift-field base form illustrated, high $f_T$ values (in the high gigahertz range), and easy compatibility as regards production and interfacing operation with other technologies are obtainable.

What is claimed is:

1. A semiconductor integrated circuit device comprising:
    an insulating substrate having a surface,
    a first mesa of semiconductor material on said surface, said semiconductor material being of one type conductivity, said first mesa having a surface relatively parallel to said surface of said substrate, and side sufaces, and
    means including said mesa defining a vertical current flow type bipolar element, said means comprising a first region of conductivity type opposite to said one type in said mesa and defining a PN junction with the remaining material of said first mesa, first terminal means on one of said side surfaces making ohmic contact to said remaining material, second terminal means making Schottky barrier rectifying contact to said remaining material, and third terminal means making ohmic contact with said first region, one of said second and said third terminal means being located on another one of said side surfaces, and the other one of said second and said third terminal means being located on said relatively parallel surface of said first mesa.

2. A semiconductor integrated circuit device as defined in claim 1 wherein said first type is N type and said opposite type is P type.

3. A semiconductor integrated circuit device as defined in claim 2 further comprising a second region of relatively high N type conductivity in said first mesa adjacent to said PN junction.

4. A semiconductor integrated circuit device as defined in claim 3 wherein said rectifying contact means is at said relatively parallel surface of said mesa, said first region having a projection thereon extending toward said rectifying contact means and terminating at a predetermined distance from said relatively parallel surface of said mesa.

5. A semiconductor integrated circuit device as defined in claim 1 wherein said first region is adjacent to said substrate and said rectifying contact means is on said relatively parallel surface of said mesa.

6. A semiconductor integrated circuit device as defined in claim 1 wherein said first region is adjacent to said relatively parallel surface of said mesa and said rectifying contact means is adjacent to said surface of said substrate.

7. A semiconductor integrated circuit device as defined in claim 1 further comprising
    a second mesa, like said first mesa, on said substrate surface, said second mesa having a first region of said one type conductivity, a portion of said first region of said second mesa being of higher degree of conductivity than the remainder thereof and being adjacent to said substrate, said second mesa also having a region of said opposite conductivity adjacent to a surface thereof with a further region of said one type conductivity within said opposite conductivity region of said second mesa,
    means making ohmic contact to said higher conductivity portion of said first region of said second mesa,
    means making ohmic contact to said further region, and
    means making ohmic contact to said opposite conductivity region together with rectifying contact to said remainder of said first region of said second mesa.

8. A semiconductor integrated circuit device as defined in claim 7 further comprising
    a second region in said first mesa of relatively high conductivity of said one type and adjacent said PN junction, wherein
    said second region in said first mesa and the higher degree of conductivity portion in said second mesa correspond in position and conductivity, and
    said semiconductor material of said one type of conductivity in said first mesa and said remainder of the first region of said second mesa correspond in position and conductivity.

9. A semiconductor integrated circuit device as defined in claim 6, further comprising
    a layer of metal silicide, buried in said first mesa adjacent the substrate,
    said layer of metal silicide participating in making said Schottky barrier rectifying contact with said remaining material of said first mesa.

* * * * *